United States Patent
Park

(10) Patent No.: US 7,365,683 B2
(45) Date of Patent: Apr. 29, 2008

(54) ACTIVE SMART ANTENNA SYSTEM AND FABRICATION METHOD THEREOF

(75) Inventor: Jae Yeong Park, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 10/799,902

(22) Filed: Mar. 12, 2004

(65) Prior Publication Data

US 2004/0178959 A1 Sep. 16, 2004

(30) Foreign Application Priority Data

Mar. 14, 2003 (KR) ............... 10-2003-0016185

(51) Int. Cl.
*H01Q 1/38* (2006.01)
(52) U.S. Cl. ............... 343/700 MS; 343/850; 257/275
(58) Field of Classification Search ......... 343/700 MS, 343/846, 853, 848, 850; 455/90; 257/275, 257/200
See application file for complete search history.

(56) References Cited

U.S. PATENT DOCUMENTS

| | | | |
|---|---|---|---|
| 5,206,655 A * | 4/1993 | Caille et al. .......... | 343/700 MS |
| 5,400,039 A | 3/1995 | Araki et al. ............. | 343/760 |
| 5,404,581 A * | 4/1995 | Honjo ..................... | 455/90.1 |
| 5,554,865 A * | 9/1996 | Larson .................... | 257/275 |
| 5,903,239 A | 5/1999 | Takahashi et al. ...... | 343/700 |
| 6,232,920 B1 * | 5/2001 | Brookner et al. ....... | 342/372 |
| 6,249,439 B1 * | 6/2001 | DeMore et al. ......... | 361/752 |
| 6,320,543 B1 | 11/2001 | Ohata et al. ............ | 343/700 |
| 6,384,648 B1 * | 5/2002 | O'Toole et al. ......... | 327/156 |
| 6,653,985 B2 * | 11/2003 | Sikina et al. ........... | 343/853 |
| 6,741,205 B2 * | 5/2004 | Nagasaku ................ | 342/174 |
| 6,781,246 B2 * | 8/2004 | Fujiwara et al. ........ | 257/780 |
| 2002/0098611 A1 | 7/2002 | Chang et al. ............ | 438/50 |

FOREIGN PATENT DOCUMENTS

| | | |
|---|---|---|
| EP | 1 152 485 A1 | 7/2001 |
| JP | 1233902 | 9/1989 |
| JP | 3196705 | 8/1991 |
| JP | 4032301 | 2/1992 |
| JP | 4352506 | 12/1992 |
| JP | 5160635 | 6/1993 |
| JP | 8070216 | 3/1996 |
| JP | 11074415 | 3/1999 |
| JP | 11-168354 | 6/1999 |
| JP | 2000-223906 | 8/2000 |
| JP | 2001-102739 | 4/2001 |

(Continued)

OTHER PUBLICATIONS

D3: Reinmut K. "Integrierte Mikrowellenschaltungen" 1983, Springer Verlag, Berlin, Heidelberg, New York, Tokyo, ISBN: 3-540-12352-0.

*Primary Examiner*—Hoanganh Le
(74) *Attorney, Agent, or Firm*—Lee, Hong, Degerman, Kang & Schmadeka

(57) ABSTRACT

Disclosed are an active smart antenna system and a method thereof. The system comprises: an antenna for receiving a signal; a low noise amplifier for amplifying a signal received through the antenna so as to minimize a noise generation; and a phase shifter for controlling a phase of the amplified signal. The antenna, the low noise amplifier, and the phase shifter are formed on one high resistance substrate.

25 Claims, 4 Drawing Sheets

FOREIGN PATENT DOCUMENTS

| | | |
|---|---|---|
| JP | 2001-168602 | 6/2001 |
| JP | 2001230506 | 8/2001 |
| JP | 2002118487 | 4/2002 |
| JP | 2002134325 | 5/2002 |
| JP | 2002250886 | 9/2002 |
| JP | 2002-290143 | 10/2002 |
| WO | WO 03/009421 A1 | 1/2003 |

* cited by examiner

ACTIVE SMART ANTENNA SYSTEM AND FABRICATION METHOD THEREOF

CROSS-REFERENCE TO RELATED APPLICATIONS

Pursuant to 35 U.S.C. § 119(a), this application claims the benefit of earlier filing date and right of priority to the Korean Application No. 10-2003-0016185, filed on Mar. 14, 2003, the content of which is hereby incorporated by reference herein in its entirety.

BACKGROUND OF THE INVENTION

1. Field of the Invention

The present invention relates to an antenna system, and more particularly, to an active smart antenna system and a fabrication method thereof.

2. Description of the Related Art

Generally, a smart antenna system is a core component necessary in a next generation communication system, and is used at a high frequency band such as a mobile vehicle satellite broadcasting/communication, a military communication, and etc. The smart antenna system can be positioned at a base station or a mobile terminal according to an arrangement size of an antenna. The smart antenna system can accommodate a large number of users, and thereby a capacity of the system can be increased.

The most core component of the smart antenna system is a phase shifter. The phase shifter can precisely pursue a usage frequency by controlling a signal. Also, the phase shifter delays a phase of an input signal by controlling a switch connected to an inductor, a capacitor, and etc. constituting the phase shifter, and thereby can convert the signal into a signal having a desired phase in an output terminal. A phase shifting apparatus that is nowadays the most applied to a vehicle satellite receiver is a passive smart antenna system for delaying a phase using a mechanical motor.

However, since the passive smart antenna system has a large size and an expensive fabrication cost, a spread ratio thereof is not high. According to this, a development of an active smart antenna system having a relatively small size and a cheap fabrication cost is absolutely required. A construction of the active smart antenna system will be explained with reference to FIG. 1.

FIG. 1 is a block diagram showing a construction of a general active smart antenna system.

As shown, the active smart antenna system comprises: an antenna 100 for transmitting and receiving a signal; a low noise amplifier (LNA) 200 for amplifying a signal received through the antenna so as to minimize a noise generation; and a phase shifter 300 for controlling a phase of the amplified signal.

Among the components constituting the active smart antenna system, the phase shifter 300 occupies a space the most and requires the most expensive cost. The phase shifter 300 is largely divided into a one-bit (constructed as 11.25° phase variator), a two-bit (constructed as 11.25° and 22.5° phase variator), a three-bit (constructed as 11.25°, 22.5°, and 45° phase variator), a four-bit (constructed as 11.25°, 22.5°, 45°, and 90° phase variator), and a five-bit (constructed as 11.25°, 22.5°, 45°, 90°, and 180° phase variator). In order to implement the active smart antenna system that can be used at a satellite broadcasting receiver, approximately one hundred of said five-bit phase shifters are necessary.

Recently, accordingly as a microwave monolithic integrated circuit (MMIC) technology is developed, a phase shifter using an electron switching device such as a high electron mobility transistor (HEMT) and a field effect transistor (FET) has been developed and an active smart antenna system using the phase shifter is actively being developed. That is, an electron switch, an inductor, a capacitor, and etc. are formed on one silicon substrate (for example, GaAs substrate), and then are packaged thus to fabricate the phase shifter 300. A technique for designing an active smart antenna system using the fabricated phase shifter 300 is being proposed.

However, in the active smart antenna system, the phase shifter 300 is constructed by combining a plurality of devices on said one silicon substrate by the MMIC technology, a semiconductor process. According to this, a fabrication cost is increased and a quality factor of the inductor (for example 8~13) is low thus not to be able to anticipate a high quality.

Also, in the active smart antenna system, not only the phase shifter 300 but also the antenna 100, the LNA 200, or transmission/reception module have to be provided together. The components are additionally mounted on a printed circuit board (PCB) thus to be assembled. Therefore, in the active smart antenna system, a lead for bonding the fabricated phase shifter 300 on the PCB is required, thereby increasing an entire size and deteriorating a quality factor of the inductor.

According to this, an active smart antenna system capable of reducing a fabrication cost, having an inductor of a high quality factor applied thereto, and easily packaging the phase shifter 300, the antenna 100, and the LNA 200, and a fabrication method thereof are required.

As aforementioned, according to the active smart antenna system in accordance with the related art, the phase shifter is fabricated by the MMIC technology, a semiconductor process, thereby increasing a fabrication cost.

Also, according to the active smart antenna system in accordance with the related art, the phase shifter is fabricated by the MMIC technology, a semiconductor process, thereby lowering a quality thereof.

Also, according to the active smart antenna system in accordance with the related art, the phase shifter is fabricated by the MMIC technology, a semiconductor process, thereby increasing a size thereof due to an individual packaging for combining the antenna, the LNA, or the transmission/reception module.

SUMMARY OF THE INVENTION

Therefore, an object of the present invention is to provide an active smart antenna system capable of reducing a fabrication cost by simultaneously implementing a phase shifter, an antenna, and a low noise amplifier on one high resistance substrate, and a fabrication method thereof.

Another object of the present invention is to provide an active smart antenna system capable of improving a quality thereof by simultaneously implementing a phase shifter, an antenna, and a low noise amplifier on one high resistance substrate, and a fabrication method thereof.

Still object of the present invention is to provide an active smart antenna system capable of reducing a size thereof by simultaneously implementing a phase shifter, an antenna, and a low noise amplifier on one high resistance substrate, and a fabrication method thereof.

To achieve these and other advantages and in accordance with the purpose of the present invention, as embodied and broadly described herein, there is provided an active smart antenna system comprising: an antenna for receiving a signal; a low noise amplifier for amplifying a signal received through the antenna so as to minimize a noise generation; and a phase shifter for controlling a phase of the amplified signal, wherein the antenna, the low noise amplifier, and the phase shifter are formed on one high resistance substrate.

To achieve these and other advantages and in accordance with the purpose of the present invention, as embodied and broadly described herein, there is also provided a method for fabricating an active smart antenna system comprising, wherein an antenna for receiving a signal, a low noise amplifier for amplifying a signal received through the antenna so as to minimize a noise generation, and a phase shifter for controlling a phase of the amplified signal are formed on one high resistance substrate.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Hereinafter, an active smart antenna system capable of reducing an entire size thereof, reducing a fabrication cost thereof, and improving a quality thereof by simultaneously implementing a phase shifter, an antenna, and a low noise amplifier on one high resistance substrate, and a fabrication method thereof will be explained with reference to the attached drawings.

FIGS. 2A to 2I are sectional views showing various structures of the active smart antenna system according to the present invention.

Figure 1:
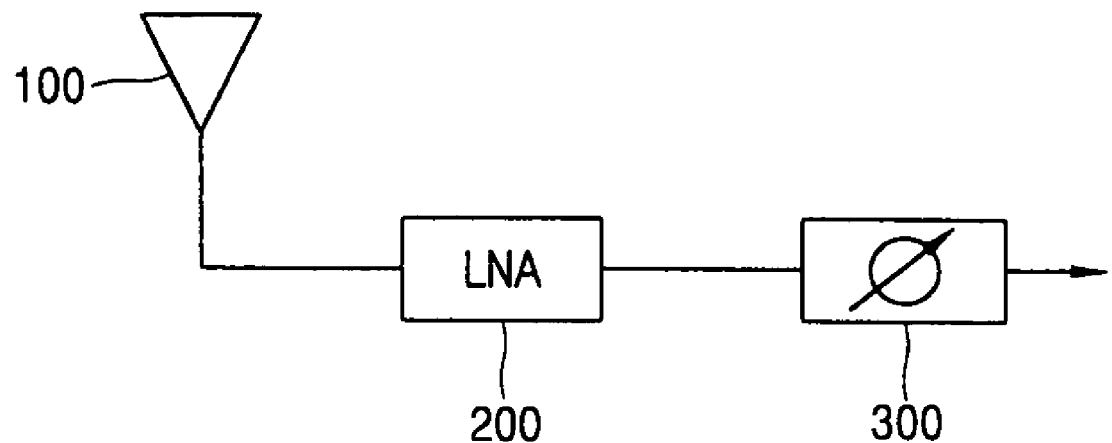
FIG. 1 is a block diagram showing a construction of a general active smart antenna system.
Figure 2A:
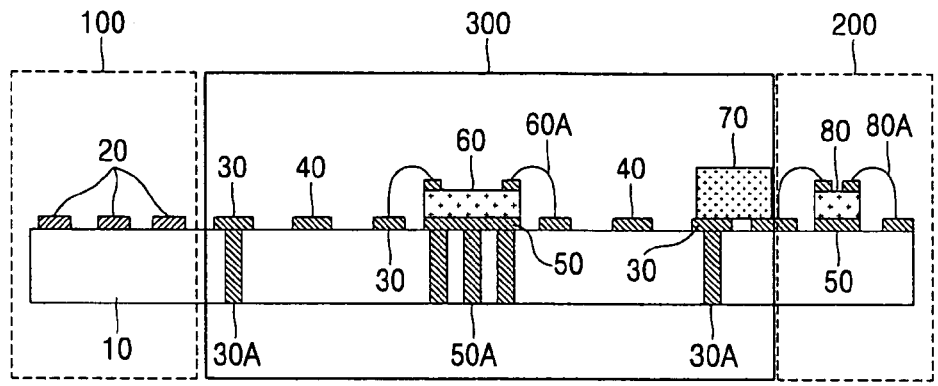
FIGS. 2A to 2I are sectional views showing various structures of the active smart antenna system according to the present invention.

As shown in FIG. 2A, the active smart antenna system according to the present invention comprises: an antenna 100 for receiving a signal; a low noise amplifier (LNA) 200 for amplifying a signal received through the antenna so as to minimize a noise generation; and a phase shifter 300 for controlling a phase of the signal amplified by the LNA 200. Herein, the antenna 100, the LNA 200, and the phase shifter 300 are constituted with various components and are formed on one high resistance substrate.

A fabrication process of the active smart antenna system of the present invention will be explained as follows.

First, a conductive layer formed of a conductive material such as copper is formed on the high resistance substrate 10. The high resistance substrate 10 is preferably selected among a high resistance silicon substrate, a high resistance ceramic substrate, and a printed circuit board (PCB).

The conductive layer formed on the high resistance substrate is patterned thus to form antenna structure materials 20 and to form signal electrodes 30, ground electrodes 50, and inductors 40 constituting the phase shifter and the low noise amplifier. Herein, the antenna 100 constituted with the antenna structure materials 20 is preferably a patch antenna or a slot antenna. The inductors 40 are preferably a strip line inductor or a spiral inductor.

The inductors 40 can be minutely fabricated by using a micro electro mechanical system (MEMS). According to this, the inductors 40 has a quality factor (for example, 50~60) more excellent than a quality factor of the conventional inductor.

On the high resistance substrate 10 where the signal electrodes 30 and the ground electrodes 50 are formed, a via hole is formed and the via hole is plated, thereby forming a via signal electrode 30A and a via ground electrode 50A. According to this, in the active smart antenna system of the present invention, the signal electrodes 30 formed at upper and lower surfaces of the high resistance substrate can be electrically connected to each other through the via hole electrode 30A.

In order to connect an electron switch 60 such as a pin diode, a high electron mobility transistor (HEMT), a field effect transistor (FET), and etc. to the signal electrodes 30 formed on the high resistance substrate 10, the electron switch 60 is installed on the ground electrode 50 as a bare chip form. That is, in order to apply a wire bonding technique, the electron switch 60 of a bare chip form provided with the signal electrodes 30 thereon is attached onto the ground electrode 50 (a physical bonding using a conductive adhesive). Next, a bonding wire 60A formed of aluminum or gold is adhered to the signal electrodes 30 formed on the electron switch 60 and the signal electrodes 30 formed on the high resistance substrate 10 by heat or supersonic waves. Herein, the electron switch 60 of a bare chip form is directly connected on the high resistance substrate 10 such as a PCB by using the bonding wire 60A, which is called a chip on board (COB) technique that is well known to the skilled person.

A capacitor 70 is connected to the signal electrodes 30 on the high resistance substrate 10 by using a general surface mounted technology (SMT). The capacitor 70 is preferably a thin film capacitor.

Also, the low noise amplifier 200 is formed by connecting a transistor 80 to the signal electrodes 30 formed on the high resistance substrate 10 in the same manner as the method for connecting the electron switch 60 of the phase shifter 300 to the signal electrodes 30 formed on the high resistance substrate 10.

Various shapes of the active smart antenna system according to the present invention where the antenna 100, the low noise amplifier 200, and the phase shifter 300 are simultaneously formed on one high resistance substrate 10 will be explained with reference to the attached drawings.

Figure 2B:
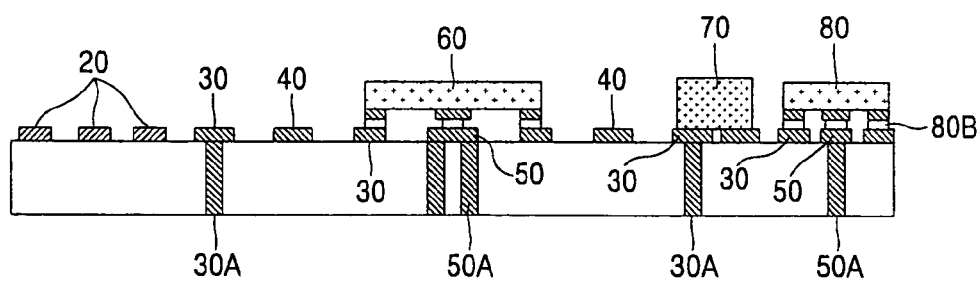

As shown in FIG. 2B, in the active smart antenna system according to the present invention, the electron switch 60 of a bare chip form of FIG. 2A is connected to the signal electrodes 30 formed on the high resistance substrate 10 by a flip chip bonding technique not the wire bonding technique.

In the active smart antenna system according to the present invention, a size of the electron switch 60 of a bare chip form is a little increased. However, since the electron switch 60 is connected to the signal electrodes 30 and the ground electrodes 50 by an adhesive more physically stable than the bonding wire, more stable structure having less inferiority rate is formed and a fabrication cost is reduced.

In the active smart antenna system according to the present invention, a cheap substrate having two surfaces was used as the high resistance substrate. However, in order to reduce the size of the phase shifter 300, a multi-layer substrate can be used instead of the cheap substrate having two surfaces as the high resistance substrate 10. Hereinafter, a structure of an active smart antenna system to which the multi-layer substrate is applied will be explained.

Figure 2C:
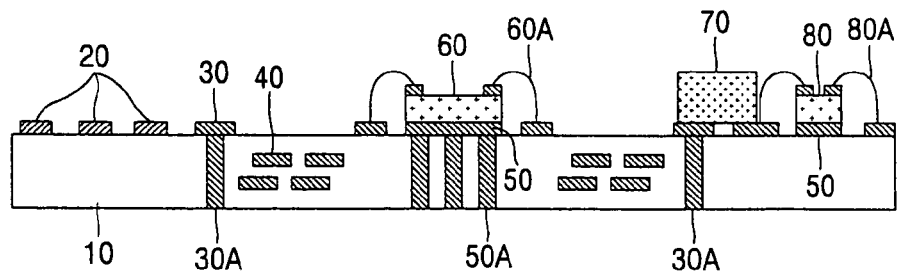

As shown in FIG. 2C, in the active smart antenna system according to the present invention, the inductors 40 of FIG. 2A are stacked inside the high resistance substrate 10. Herein, the high resistance substrate 10 is preferably one among an Epoxy PCB, a Teflon PCB, and an Low temperature co-fired ceramic (LTCC) PCB.

According to the active smart antenna system of the present invention, the inductors 40 are stacked inside the high resistance substrate 10, so that a structural area of the phase shifter 300 is reduced and thus an entire structure is greatly reduced.

Figure 2D:
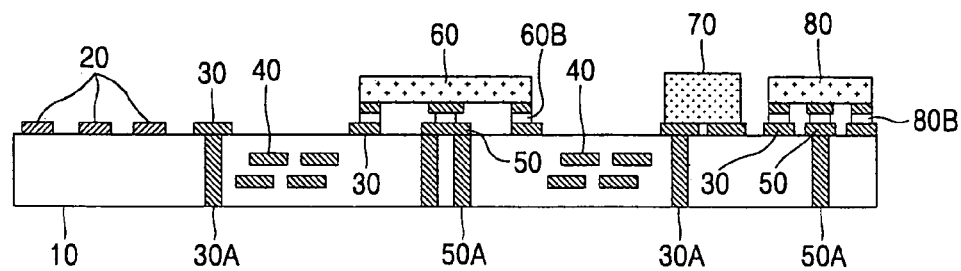

As shown in FIG. 2D, in the active smart antenna system of the present invention, the electron switch 60 of a bare chip form of FIG. 2C is connected to the signal electrodes 30 formed on the high resistance substrate 10 by the flip chip bonding technique not the wire bonding technique.

According to the active smart antenna system of the present invention, the inductors 40 are stacked inside the high resistance substrate 10 and the electron switch 60 of a bare chip form is connected to the signal electrodes 30 formed on the high resistance substrate 10 by the flip chip bonding technique, so that a structural area of the phase shifter 300 is reduced, a stable system structure having less inferiority rate is formed, and a fabrication cost is reduced.

Figure 2E:
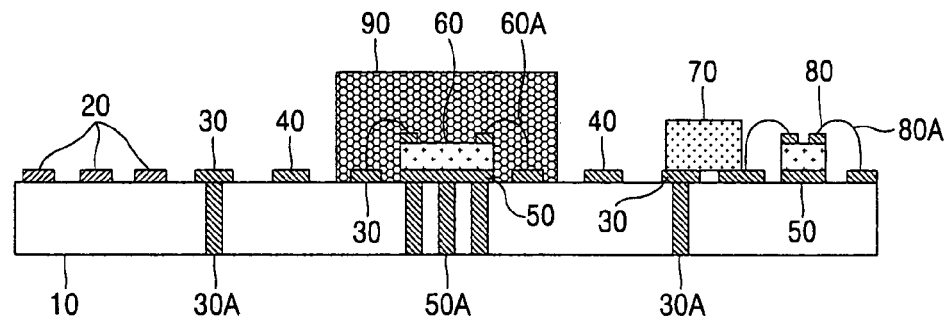
Figure 2F:
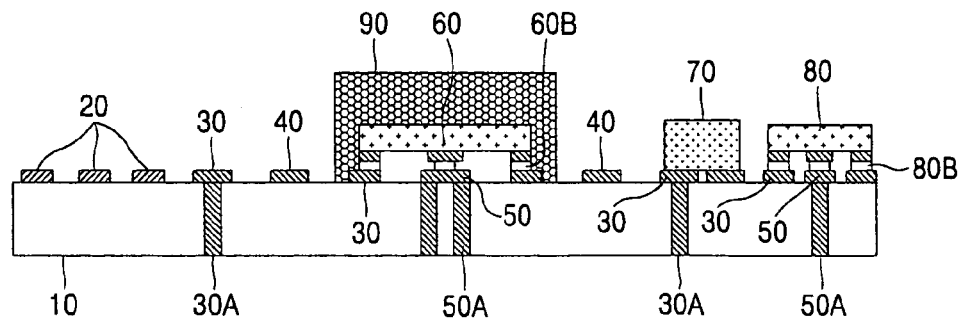

As shown in FIGS. 2E and 2F, in the active smart antenna system of the present invention, a polymeric protection material 90 such as an epoxy is coated on a part that the electron switch 60 of a bare chip form is positioned. According to this, the structurally stable active smart antenna system can be implemented. Herein, the polymeric protection material 90 can be partially applied in order to reinforce a physically weak part such as the electron switch 60 of a bare chip form, or can be applied on the entire surface of the high resistance substrate 10.

Hereinafter, will be explained the active smart antenna system according to the present invention where the signal electrodes 30 and the inductors 40 are all formed on the high resistance substrate 10 in order to reduce the fabrication cost.

Figure 2G:
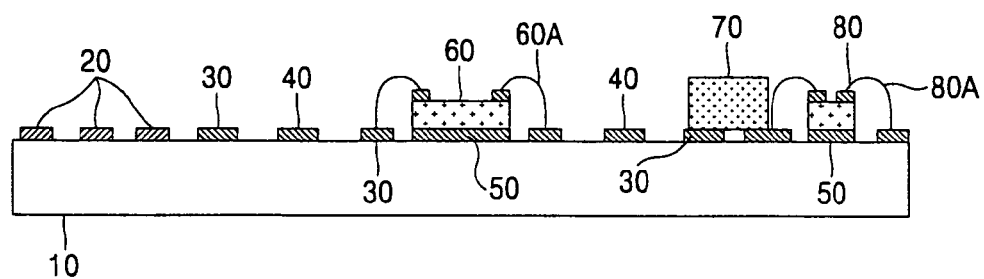
Figure 2H:
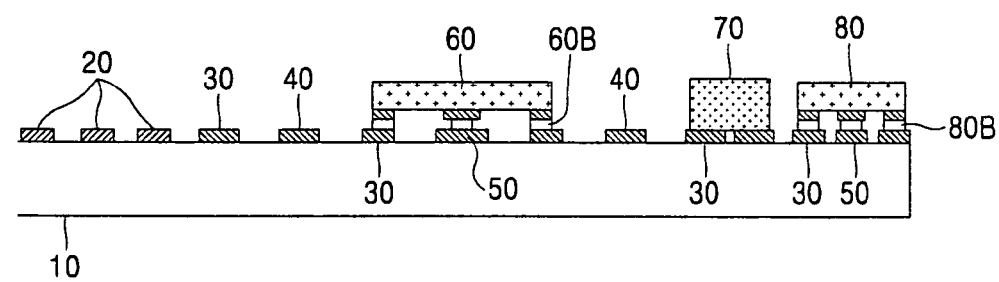

As shown in FIGS. 2G and 2H, in the active smart antenna system of the present invention, the signal electrodes 30 and the inductors 40 are formed on the high resistance substrate 10 without forming the via hole on the high resistance substrate 10 and without stacking the inductors 40 inside the high resistance substrate 10. According to this, the fabrication cost of the high resistance substrate 10 and the fabrication time can be reduced.

Hereinafter, an active smart antenna system of the present invention capable of reducing a lead inductance that may be generated due to heights of the electron switch 60 of a bare chip form and the transistor 80 will be explained.

Figure 2I:
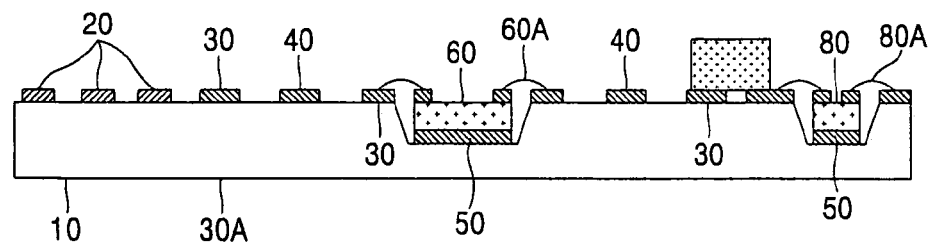

As shown in FIG. 2I, the high resistance substrate 10 of a part that the electron switch 60 of a bare chip form and the transistor 80 are to be installed is etched as much as a predetermined height. Then, the electron switch 60 of a bare chip form and the transistor 80 are respectively installed at the etched part. According to this, the interval between the electron switch 60 of a bare chip form and the signal electrodes 30 and the interval between the transistor 80 and the signal electrodes 30 are decreased, thereby improving the function of the system due to the decrease of the lead inductance.

As aforementioned, in the active smart antenna system of the present invention, the phase shifter, the antenna, and the low noise amplifier are simultaneously implemented on one high resistance substrate, thereby reducing the fabrication cost thereof.

Also, in the active smart antenna system of the present invention, the phase shifter, the antenna, and the low noise amplifier are simultaneously implemented on one high resistance substrate, thereby reducing the size thereof.

Additionally, in the active smart antenna system of the present invention, the phase shifter, the antenna, and the low noise amplifier are simultaneously implemented on one high resistance substrate, thereby enhancing the quality thereof.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. An active smart antenna system comprising:
an antenna for receiving a signal;
a low noise amplifier for amplifying a signal received through the antenna so as to minimize a noise generation; and
a phase shifter for controlling a phase of the amplified signal, wherein the antenna, the low noise amplifier, and the phase shifter are formed on one high resistance substrate that is essentially non-conductive,
the phase shifter comprises signal electrodes, ground electrodes, inductors respectively formed of the same conductive material, and an electron switch and a capacitor connected to the signal electrodes,
the electron switch is formed as a bare chip form which is attached onto one of the ground electrodes by physical bonding using a conductive adhesive, and
the inductors are stacked inside the high resistance substrate.

2. The active smart antenna system of claim 1, wherein the high resistance substrate is one selected among a high resistance silicon substrate, a high resistance ceramic substrate, and a printed circuit board (PCB).

3. The active smart antenna system of claim 2, wherein the high resistance substrate is a substrate of two surfaces having signal electrodes for connecting upper and lower surfaces thereof.

4. The active smart antenna system of claim 3, wherein the low noise amplifier is formed as a bare chip form connected to the signal electrodes by a bonding wire.

5. The active smart antenna system of claim 3, wherein the low noise amplifier is formed as a bare chip form connected to the signal electrodes by a flip chip bonding technique.

6. The active smart antenna system of claim 2, wherein the antenna is one of a patch antenna and a slot antenna.

7. The active smart antenna system of claim 1, wherein the inductor is formed as a strip line structure or a spiral structure by a micro electro mechanical system (MEMS) technique.

8. The active smart antenna system of claim 1, wherein the electron switch is connected to the signal electrodes by a bonding wire.

9. The active smart antenna system of claim 8, wherein the electron switch includes a polymeric protection material.

10. The active smart antenna system of claim 1, wherein the electron switch is formed at an etched part of the high resistance substrate after partially etching the high resistance substrate.

11. The active smart antenna system of claim 1, wherein the electron switch is connected to the signal electrodes by a flip chip bonding technique.

12. The active smart antenna system of claim 11, wherein the electron switch includes a polymeric protection material.

13. The active smart antenna system of claim 1, wherein the high resistance substrate is a Low temperature co-fired ceramic (LTCC) PCB.

14. A method for fabricating an active smart antenna system, the method comprising:
uniformly forming a conductive layer on one high resistance substrate that is essentially non-conductive;
patterning the conductive layer and thereby forming signal electrodes, ground electrodes, and inductors;
forming an electron switch connected to the signal electrodes on the ground electrodes and forming a capacitor connected to the signal electrodes; and
forming an antenna for receiving a signal, a low noise amplifier for amplifying the signal received through the antenna so as to minimize a noise generation, and a phase shifter for controlling a phase of the amplified signal on the high resistance substrate, wherein the electron switch is formed as a bare chip form which is attached onto one of the ground electrodes by physical bonding using a conductive adhesive and the inductors are stacked inside the high resistance substrate.

15. The method of claim 14, wherein the high resistance substrate is one selected among a high resistance silicon substrate, a high resistance ceramic substrate, and a printed circuit board (PCB).

16. The method of claim 15, wherein the high resistance substrate is a substrate of two surfaces having signal electrodes for connecting upper and lower surfaces thereof.

17. The method of claim 14, wherein the electron switch is connected to the signal electrodes by a bonding wire.

18. The method of claim 17, further comprising a step for forming a polymeric protection material for protecting the electron switch.

19. The method of claim 14, wherein the electron switch is connected to the signal electrodes by a flip chip bonding technique.

20. The method of claim 19, further comprising a step for forming a polymeric protection material for protecting the electron switch.

21. The method of claim 14, wherein the electron switch is formed at an etched part of the high resistance substrate after partially etching the high resistance substrate.

22. The method of claim 21, further comprising a step for forming a polymeric protection material for protecting the electron switch.

23. The method of claim 14, wherein the antenna is formed by patterning the conductive layer.

24. The method of claim 14, wherein the antenna is one of a patch antenna and a slot antenna.

25. The method of claim 14, further comprising a step for forming a low noise amplifier connected to the signal electrodes.

* * * * *